(12) United States Patent
Yeh

(10) Patent No.: US 7,002,411 B2
(45) Date of Patent: Feb. 21, 2006

(54) AMPLIFIER WITH FIXED INPUT IMPEDANCE OPERATED IN VARIOUS GAIN MODES

(75) Inventor: En-Hsiang Yeh, Hsin-Chu (TW)

(73) Assignee: MediaTek Inc., Hsin-Chu Hsien (TW)

( * ) Notice: Subject to any disclaimer, the term of this patent is extended or adjusted under 35 U.S.C. 154(b) by 36 days.

(21) Appl. No.: 10/605,427

(22) Filed: Sep. 30, 2003

(65) Prior Publication Data

US 2004/0232987 A1    Nov. 25, 2004

(30) Foreign Application Priority Data

May 20, 2003    (TW) .............................. 92113646 A (51) Int. Cl.
*H03F 3/45* (2006.01)
(52) U.S. Cl. ...................... 330/252; 330/254
(58) Field of Classification Search ............... 330/252, 330/254, 260, 261; 327/359
See application file for complete search history.

(56) References Cited

U.S. PATENT DOCUMENTS

| 5,486,791 | A | * | 1/1996 | Spitalny et al. ............. 330/282 |
| 5,721,513 | A | * | 2/1998 | Yuasa ......................... 330/282 |
| 6,127,886 | A | | 10/2000 | Khabbaz et al. |
| 6,545,534 | B1 | * | 4/2003 | Mehr ........................... 330/69 |

FOREIGN PATENT DOCUMENTS

WO    WO-03077415 A1    9/2003

* cited by examiner

*Primary Examiner*—Henry Choe
(74) *Attorney, Agent, or Firm*—Winston Hsu (57) ABSTRACT

An amplifier with substantially fixed input impedance being operated in a plurality of gain modes. The amplifier includes an input port for receiving an input signal, an amplifying circuit for amplifying the input signal with corresponding amplifying ratios in various gain modes, a plurality of resistive negative feedback circuits electrically connected to the input port and the amplifying circuit for keeping the input impedance substantially fixed in various gain modes, and an output port for outputting the input signal processed by the amplifying circuit.

17 Claims, 11 Drawing Sheets

| Gain mode | Bias B5' | Bias B6' |
|---|---|---|
| High-gain mode | 1.6V | 0V |
| Medium-gain mode | 1.6V | 1.6V |
| Low-gain mode | 1.6V | 2.7V |

AMPLIFIER WITH FIXED INPUT IMPEDANCE OPERATED IN VARIOUS GAIN MODES

BACKGROUND OF INVENTION

1. Field of the Invention

The invention relates to an amplifier with substantially fixed input impedance and related method, and more particularly, to an amplifier and related method for utilizing a plurality of resistive negative feedback circuits to process a plurality of feedback signals so as to keep the input impedance of the amplifier substantially fixed in various gain modes.

2. Description of the Prior Art

Low-noise amplifiers (LNA) are indispensable elements in a receiver of a wireless communications system and used for providing signals received by an antenna with gains and sensitivity. Since the low-noise amplifier is installed in a front end of the receiver to process generally very weak signals, the performances of the low-noise amplifier, such as the noise figure, the RF gain, and the non-linearity, are highly related to the gross performance of receiver.

Figure 1:
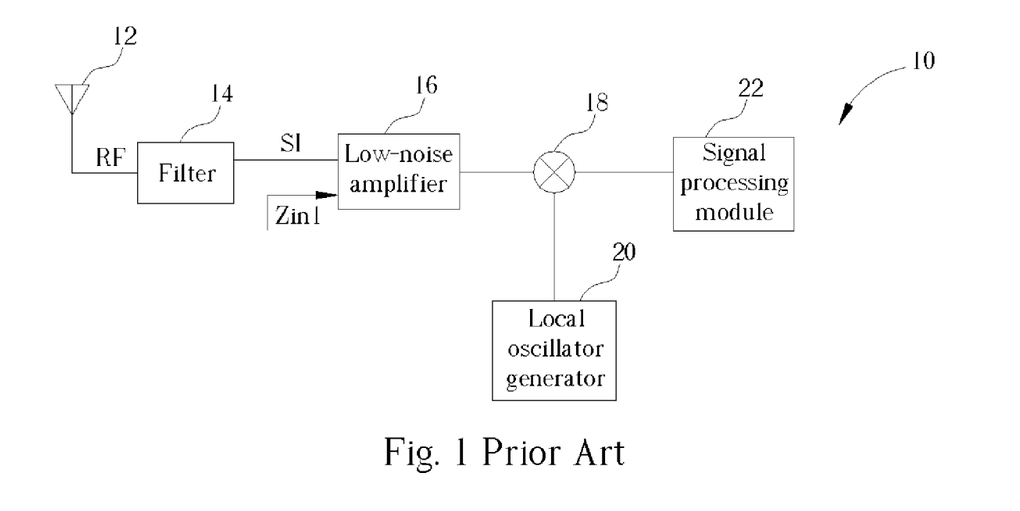
FIG. 1 is a functional block diagram of a receiver in a wireless communications system.

Please refer to FIG. 1, which is a functional block diagram of a receiver 10 in a wireless communications system. The receiver 10 in the present embodiment is mainly applied to the wireless communications system operating at 0.9 GHz to 10 GHz. Nowadays, most commercial wireless communications systems, such as GSM, Blue-tooth, and WLAN, operate around the frequency region (0.9 GHz to 10 GHz). The receiver 10 includes an antenna 12, a filter 14, a low-noise amplifier 16, a mixer 18, a local oscillator generator 20, and a signal processing module 22. The antenna 12 is used to receive an RF signal RF. After the RF signal RF is obtained from the antenna 12, the filter 14 will operate a frequency selection process for the RF signal RF to generate an input signal Si. The low-noise amplifier 16 then amplifies the input signal Si by a predetermined gain ratio. Since the received RF signal RF and the filtered input signal Si are very weak, the low-noise amplifier 16 installed after the filter 14 should bring very low noise. Afterwards, the input signal SI is outputted from the low-noise amplifier 16 and down-sampled to a specific frequency by the mixer 18 and the local oscillator generator 20. The signal processing module 22 will proceed with advanced operations such as demodulation.

When being implemented, under various conditions, the receiver 10 of the wireless communications system cannot receive the RF signal RF with fixed magnitude. Taking the signal transmission in a cellular phone as an instance, when the receiver 10 approaches the signal emitting end, such as a base station, the magnitude of the RF signal RF is higher than that when the receiver 10 is far away from the signal emitting end. Since the exceeding RF signal RF may saturate the system and disable the amplifier to linearly amplify signals, the low-noise amplifier 16 is generally designed as a variable gain amplifier operating in a plurality of gain modes. In the following statement, the variable gain amplifier can operate in two gain modes: a high-gain mode and a low-gain mode. As shown in FIG. 1, when the input signal SI is small, the low-noise amplifier 16 operates in the high-gain mode, and the input signal SI is amplified by a higher gain ratio and then outputted. On the other hand, when the input signal SI is large, the low-gain mode is applied to process the input signal SI for avoiding the saturation of the low-noise amplifier 16. Please refer to FIG. 2, which is a functional block diagram of an embodiment of the prior-art low-noise amplifier 16 shown in FIG. 1. The low-noise amplifier 16 is a variable gain amplifier, which can operate respectively in a high-gain mode and a low-gain mode. The low-noise amplifier 16 includes an input port 32, a gain circuit 34, and an output port 36. The input port 32 is used to receive the input signal Si, and the gain circuit 34 includes transistors Q1–Q5 and adjustable three biases B1–B3. The gain circuit 34 can be used to amplify the input signal SI by two corresponding (high/low) gain ratios respectively in the two (high/low) gain modes. The output port 36 is used to output the input signal SI amplified by the gain circuit 34.

Figure 2:
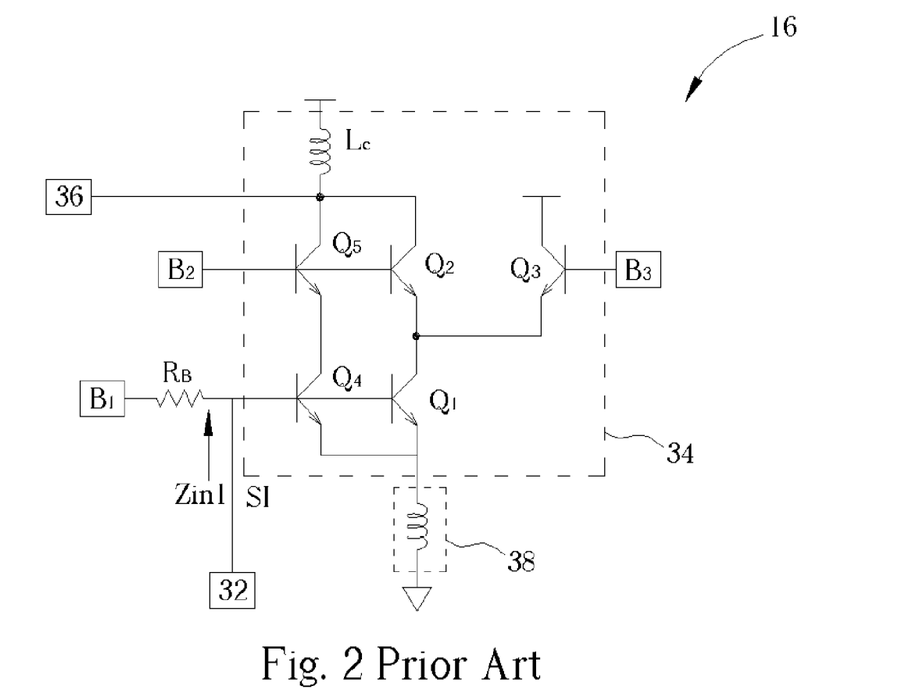
FIG. 2 is a functional block diagram of an embodiment of the prior-art low-noise amplifier shown in FIG. 1.

Please continue to refer to FIG. 2. When the low-noise amplifier 16 operates in the high-gain mode, the bias B2 is higher than the bias B3, the transistors Q1, Q2, Q4, Q5 turn on, and the transistor Q3 turns off. The input signal SI is amplified through the transistors Q1, Q2, Q4, Q5 in the gain circuit 34 and outputted by the output port 36. When the low-noise amplifier 16 operates in the low-gain mode, the bias B3 is higher than the bias B2, the transistors Q1, Q3, Q4, Q5 turn on, and the transistor Q2 turns off. The input signal SI is amplified through the transistors Q4, Q5 and outputted by the output port 36. By initially making the sizes of the transistors Q1, Q2, Q3 larger than those of the transistors Q4, Q5, only a little part of the input signal SI passes the transistor Q4, Q5 to the output port 36, while most of the input signal SI passes the transistors Q1, Q3 to a voltage source VCC. Therefore, the switch between the high-gain mode and the low-gain mode relies on the comparison between the bias B2 and the bias B3 with constant bias B1. When being implemented, the bias B2 remains at a predetermined voltage value, while the bias B3 is switched between two values (higher/lower than the bias B2).

In addition, an amplifier generally includes an input impedance and an output impedance. In a system, once the amplifier is electrically connected to other circuitries, a loading effect may occur to affect the performances of the whole system due to the (input/output) impedance mismatch between the amplifier and other circuitries. Please refer to both FIG. 1 and FIG. 2. The low-noise amplifier 16 includes an input impedance Zin1, an inductive negative feedback circuit 38, and an inductive loading Lc. For avoiding the impedance mismatch between the filter 14 and the low-noise amplifier 16 to affect the response of the filter 14 and the performance of the low-noise amplifier 16, in the prior-art embodiment, the emitters of the transistor Q1, Q4 are electrically connected to the inductive negative feedback circuit 38 in order to adjust the input impedance Zin1. Therefore, when the low-noise amplifier 16 is switched between the high-gain mode and the low-gain mode, the response of the filter 14 will not change due to the change of the input impedance Zin1 and thus the performance of the receiver 10 can be maintained.

Figure 3:
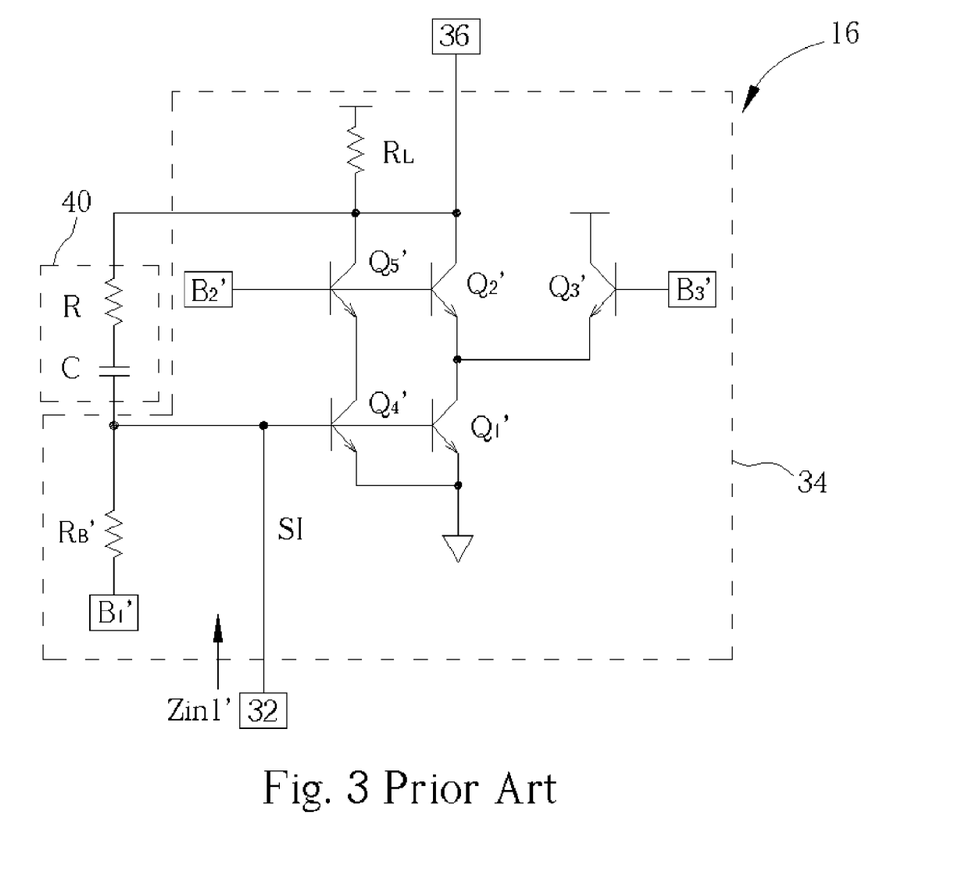
FIG. 3 is a functional block diagram of another embodiment of the prior-art low-noise amplifier shown in FIG. 1.
Figure 4:
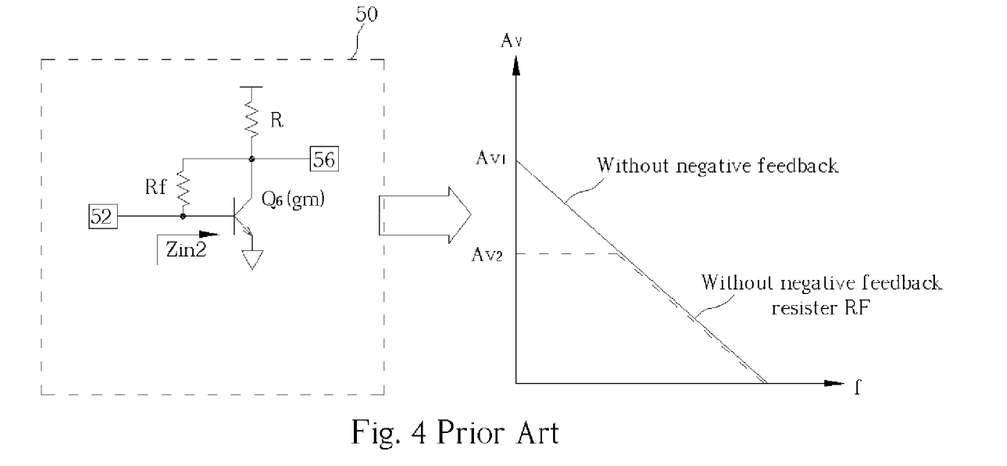
FIG. 4 is an amplifier combined with a resistor Rf used for resistive negative feedback circuit.

However, since the circuit area of the inductive negative feedback circuit 38 is too large, concerning the cost, the resistive loading and the resistive negative feedback circuit are more acceptable for the industry. Please refer to FIG. 3, which is a functional block diagram of another embodiment of the prior-art low-noise amplifier 16 shown in FIG. 1. The low-noise amplifier 16 is still a variable gain amplifier operating in the high-gain mode and the low-gain mode. Similar to the embodiment shown in FIG. 2, the low-noise amplifier 16 consists of the input port 32, the gain circuit 34, the output port 36, and an input impedance Zin1. The gain circuit 34 includes the transistors Q1–Q5 and adjustable three biases B1-B3" for amplifying the input signal SI by corresponding two (high/low) gain ratios respectively in the two (high/low) gain modes. The main difference between the present embodiment and the previous one is that in the present embodiment, a resistive loading RL and a resistive negative feedback circuit 40 substitute the inductive loading Lc and the inductive negative feedback circuit 38 shown in FIG. 2 to achieve a negative feedback function. For clarifying the characteristics of the resistive negative feedback, we take another amplifier as an instance. Please refer to FIG. 4, which is an (simple) amplifier 50 combined with a resistor Rf used for resistive negative feedback circuit. The amplifier 50 consists of a transistor Q6, an input port 52, an output port 56, an effective resistor R, and a resistor Rf for negative feedback. Without the resistor Rf (for negative feedback) involved, the amplifier has the voltage gain, $$Av1 = g_m \cdot R$$

wherein $g_m$ is a characteristic parameter of the transistor Q6. As shown in FIG. 4, the real line shows a frequency response of the amplifier 50 without the negative feedback (the horizontal axis represents the frequency f, and the vertical axis represents the gain Av). With the resistor Rf involved, the gain diminishes to $$Av2 \approx g_m \cdot R \cdot Rf/(Rf+R),$$

and the dotted line shown in FIG. 4 represents the frequency response of the amplifier 50 with the negative feedback. As shown in FIG. 4, the diminished gain (reduced by $$Rf/(Rf+R)))$$

can instead bring a better frequency response for the gain ratio of the frequency response remains flat over a wider frequency range. In the meantime, the distortion is also reduced along with the reduction of the gain ratio. In addition, the input impedance Zin2 of the amplifier 50 is changed to $$Zin2 \approx (Rf+R)/(g_m \cdot R)$$

by the effect of the resistor Rf; that is, the resistive negative feedback circuit 40 can be used to adjust the input impedance Zin2 of the amplifier.

Please refer back to FIG. 3. The resistive negative feedback circuit 40 is a resistor R electrically connected to a capacitor C. The embodiment shown in FIG. 3 operates similarly to the embodiment shown in FIG. 2. When the low-noise amplifier 16 operates in the high-gain mode, partial input signal SI processed and outputted to the output port 36 will be fed back from the output port 36 to the input port 32 via the resistive negative feedback circuit 40, called a feedback signal. However, when the low-noise amplifier 16 is switched to the low-gain mode, a little input signal SI will pass the transistors Q4', Q5' to the output port 36, while most of the input signal SI pass the transistors Q1', Q3' to a voltage source VCC'; that is, only a little feedback signal passes the resistive negative feedback circuit 40 back to the input port 32. Therefore, in various gain modes, the resistive negative feedback circuit 40 cannot be used to adjust the input impedance so that the input impedance Zin1' ill alter in different gain modes. As we know, the filtering response of the filter 14 will be distorted by the impedance mismatch between the filter 14 and the low-noise amplifier 16, and the performances of the low-noise amplifier 16 will be affected.

SUMMARY OF INVENTION

It is therefore a primary objective of the claimed invention to provide an amplifier and related method for utilizing a plurality of resistive negative feedback circuits to process corresponding feedback signals so as to keep the input impedance of the amplifier substantially fixed in various gain modes and to solve the above-mentioned problems.

In the amplifier of the claimed invention, a plurality of resistive negative feedback circuits are respectively installed in a plurality of corresponding paths through which a feedback signal will pass in various gain modes. In each gain mode, at least a corresponding resistive negative feedback circuit will be used to process the corresponding feedback signal, so that the input impedance of the amplifier can remain substantially fixed in various gain modes. In addition, at least a predetermined resistive negative feedback circuit is connected to corresponding switch device for determining whether the feedback signal passes the predetermined resistive negative feedback circuit to the input port according to the corresponding gain mode.

In the claimed invention, a differential amplifier, operating in a differential mode, is disclosed and achieved by combining two amplifiers of the same characteristics. The differential amplifier of the present invention still has substantially fixed input impedance by utilizing a plurality of resistive negative feedback circuits and at least a corresponding switch device to process the feedback signal in various gain modes, so that the input impedance of the differential amplifier can remain substantially fixed in various gain modes. In addition, with the characteristics of the differential mode, the differential amplifier can stop being interfered with and generating interference while operating with a wider frequency response.

According to the claimed invention, an amplifier with substantially fixed input impedance when operating in a plurality of gain modes is disclosed. The amplifier comprises an input port for receiving an input signal, a gain circuit for amplifying the input signal by corresponding gain ratios in various gain modes, a plurality of resistive negative feedback circuits electrically connected to the input port and the gain circuit for keeping the input impedance of the amplifier substantially fixed in various gain modes, and an output port for outputting the input signal amplified by the gain circuit.

According to the claimed invention, a method used in an amplifier for keeping the input impedance of the amplifier substantially fixed in a plurality of gain modes is disclosed. The amplifier comprises a gain circuit and a plurality of resistive negative feedback circuits. The method comprises utilizing the gain circuit to switch the amplifier among various gain modes, and utilizing the plurality of resistive negative feedback circuits to keep the input impedance of the amplifier substantially fixed in various gain modes.

According to the claimed invention, a differential amplifier with substantially fixed input impedance when operating in a plurality of gain modes comprises: a positive input port for receiving a positive input signal; a negative input port for receiving a negative input signal; a positive amplifier circuit electrically connected to the positive input port, the positive amplifier circuit comprising: a positive gain circuit for amplifying a positive input signal by corresponding gain ratios; and a plurality of positive resistive negative feedback circuits for keeping the input impedance of the positive amplifier circuit substantially fixed in various gain modes; and a negative amplifier circuit electrically connected to the negative input port, the negative amplifier circuit comprising: a negative gain circuit for amplifying a negative input signal by corresponding gain ratios; and a plurality of negative resistive negative feedback circuits for keeping the input impedance of the negative amplifier circuit substantially fixed in various gain modes; a positive output port electrically connected to the positive amplifier circuit for outputting the processed positive input signal; and a negative output port electrically connected to the negative amplifier circuit for outputting the processed negative input signal.

These and other objectives of the present invention will no doubt become obvious to those of ordinary skill in the art after reading the following detailed description of the preferred embodiment, which is illustrated in the various figures and drawings.

DETAILED DESCRIPTION

Figure 5:
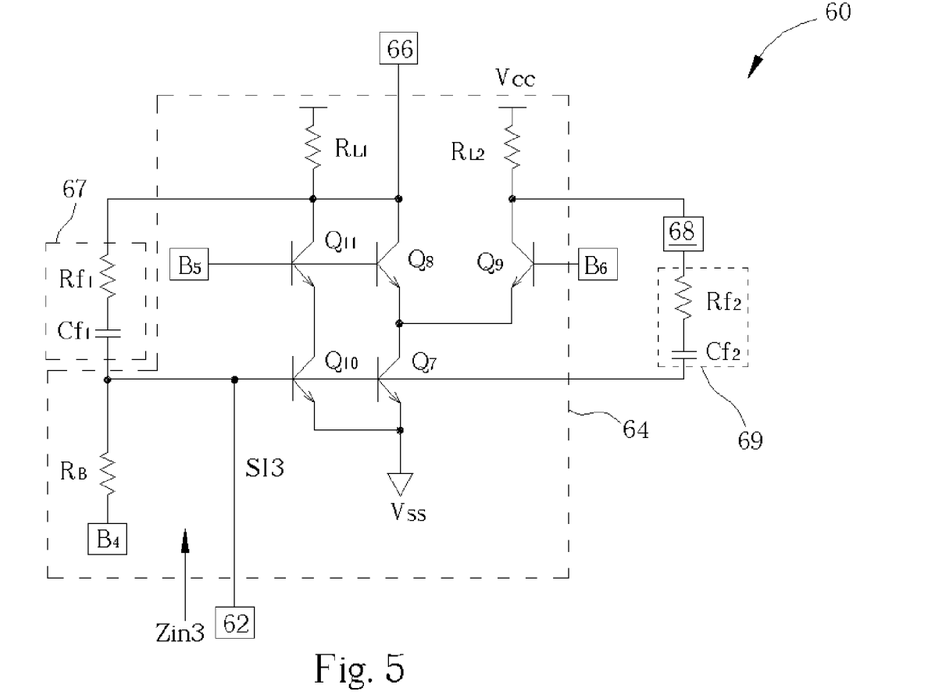
FIG. 5 is a schematic diagram of an embodiment of an amplifier according to the present invention.

Please refer to FIG. 5, which is a schematic diagram of an embodiment of an amplifier 60 according to the present invention. Similar to the prior-art embodiments shown in FIG. 2 and FIG. 3, the amplifier 60 in the present embodiment includes an input port 62, a gain circuit 64, an output port 66, and an input impedance Zin3. The input port 62 is used to receive an input signal S13, and the gain circuit 64 includes the transistors Q7–Q11 and three adjustable biases B4–B6. In contrast to the embodiment shown in FIG. 2, the transistors Q7–Q11 respectively correspond to the transistors Q1–Q5, and the three biases B4–B6 respectively correspond to the biases B1–B3. The gain circuit 64 is also used to amplify the input signal S13 received from the input port 62 by corresponding gain ratios in various gain modes. The output port 66 is used to output the input signal SI amplified by the gain circuit 64. The present embodiment inherits the designation of two gain modes (in the prior-art embodiments): a high-gain mode and a low-gain mode. When the bias B5 is higher than the bias B6, the amplifier 60 operates in the high-gain mode. The input signal S13 is amplified by the transistors Q7, Q8, Q10, Q11 in the gain circuit 64 and outputted to the output port 66. When the bias B6 is higher than the bias B5, the amplifier 60 operates in the low-gain mode; in the meantime, only a little part of the input signal S13 will pass the transistors Q10, Q11 to the output port 66, while most of the input signal S13 will pass the transistors Q7, Q9 to a voltage source VCC. Therefore, in the present embodiment, the switch between the high-gain mode and the low-gain mode is still determined by comparing the bias B5 with the bias B6.

In each gain mode, a feedback signal will be fed back to the input port via at least a corresponding path. In the present embodiment, the amplifier 60 includes two resistive negative feedback circuits, a high gain resistive negative feedback circuit 67 and a low gain resistive negative feedback circuit 69, which are respectively implemented by a resistor electrically connected to a capacitor (the high gain resistive negative feedback circuit 67 includes a resistor Rf1 and a capacitor Cf1; the low gain resistive negative feedback circuit 69 includes a resistor Rf2 and a capacitor Cf2). The high gain resistive negative feedback circuit 67 is mainly used to process the feedback signal in the high-gain mode, and the low gain resistive negative feedback circuit 69 is used to process the feedback signal in the low-gain mode. Refer to both the prior-art embodiment shown in FIG. 3 and the present embodiment, the high gain resistive negative feedback circuit 67 corresponds to the resistive negative feedback circuit shown in FIG. 3; that is, in the high-gain mode, the feedback signal will be fed back form the output port 66 to the input port 62 mainly via the high gain resistive negative feedback circuit 67, while in the low-gain mode, the feedback signal is fed back from the voltage source VCC to the input port 62 mainly via the low gain resistive negative feedback circuit 69. In addition, the amplifier 60 further includes a switch device 68, which is electrically connected to the low gain resistive negative feedback circuit 69. Therefore, when being implemented, in the high-gain mode, the switch device 68 will be opened, so that the feedback signal will not be affected by the low gain resistive negative feedback circuit 69 (the resistor Rf2 and the capacitor Cf2) and be fed back from the output port 66 to the input port 62 mainly via the high gain resistive negative feedback circuit 67. In the low-gain mode, due to that most of the input signal S13 will pass the transistors Q7, Q9 to the voltage source VCC, in order to process the signal fed back via the voltage source VCC, the switch device 68 will be closed so that most of the feedback signal is fed back from the voltage source VCC to the input port 62 via the low gain resistive negative feedback circuit 69. Therefore, by properly determining the values of the resistor Rf2 and the capacitor Cf2, the input impedance Zin3 (of the amplifier 60) can remain substantially fixed in both the low-gain mode and the high-gain mode for avoiding affecting the performances of the filter.

Please notice that the types of the transistors Q7–Q11 in the above-mentioned embodiment can be bipolar junction the transistors (BJT) or metal-oxide semiconductor (MOS) transistors. Please refer to FIG. 6, which is a schematic diagram of another embodiment showing an amplifier 80 according to the present invention. Inheriting the characteristics of the former embodiment shown in FIG. 5, the amplifier 80 of the present embodiment also includes an input port 82 (for receiving an input signal S13), a gain circuit 84, and an output port 86. In addition, the amplifier 80 includes an input impedance Zin3. The gain circuit 84 consists of transistors Q7'–Q11', three adjustable biases B4'–B6', a high gain resistive negative feedback circuit 87 (including a resistor Rf1' and a capacitor Cf1'), and a low gain resistive negative feedback circuit 89 (including a resistor Rf2' and a capacitor Cf2'). The main difference between the present embodiment and the embodiment shown in FIG. 5 is that the two resistive negative feedback circuits in the present embodiment are installed with switch devices, a first switch device 83 electrically connected to the high gain resistive negative feedback circuit 87 and a second switch device 85 electrically connected to the low gain resistive negative feedback circuit 89. The first switch device 83 can be implemented by a transistor Q12 and a control signal Ctr1, and the second switch device 85 can also be implemented by a transistor Q13 and a control signal Ctr2. The second switch device 85 can correspond to the switch device 68 in the embodiment shown in FIG. 5. Therefore, in the high-gain mode, the second switch device 85 is opened, and the first switch device 83 is closed so that the feedback signal can be fed back from the output port 86 to the input port 82 totally via the high gain resistive negative feedback circuit 87. On the other hand, in the low-gain mode, the first switch device 83 is opened, and the second switch device 85 is closed so that the feedback signal can be fed back from the voltage source VCC' to the input port 82 totally via the low gain resistive negative feedback circuit 89. Similarly, by properly determining the values of the resistor Rf1', the capacitor Cf1', the resistor Rf2', and the capacitor Cf2', the input impedance Zin3' of the amplifier 80 can remain substantially fixed in the low-gain mode and the high-gain mode.

In fact, the number of gain mode is not limited to just two: "high" and "low". Regarding the embodiment shown in FIG. 6, when being implemented, the bias B5' can be kept at a predetermined voltage value, while the bias B6' is switched among three different voltages respectively higher than, low than, or equal to the bias B5' to achieve the transformation among three different gain modes. Please refer to FIG. 7, which is a schematic diagram of a detailed embodiment shown in FIG. 6. In order to emphasize the switch among three different voltages corresponds to the transformation among three different gain modes, the embodiment shown in FIG. 7 shows detailed circuitries of the three adjustable biases B4'–B6'. The three biases B4'–B6' respectively correspond to the three bias suppliers 90, 91, 92. The bias B5' is substantially fixed at a predetermined voltage value, and the predetermined voltage value is shown in FIG. 8, which is a list illustrating the three biases B4'–B6' shown in FIG. 7. As shown in FIG. 8, the predetermined voltage value of the bias B5' is 1.6, and the bias B6' can be switched between a high voltage value (2.7V) and a ground voltage GND (OV) to switch the amplifier 80 between the low-gain mode and the high-gain mode. When the bias B6 is totally the same as the bias B5' (1.6V), among the input signal S13, the amount delivered from the transistors Q10', Q11' to the output port 86 is similar to that delivered from the transistors Q7', Q9' to the voltage source VCC'. Therefore, the gain ratio is located between the gain ratio in the high-gain mode and that in the low-gain mode; the situation is called a medium-gain mode. In the medium-gain mode, the first switch device 83 and the second switch device 85 both conduct so that the input impedance Zin3' of the amplifier 80 in the medium-gain mode remains the same as that in the high/low-gain mode. Therefore, the amplifier 80 operating in the three different gain modes (high, low, and medium) has a substantially fixed input impedance Zin3'. In addition, the number of the gain modes is not restricted to a certain number; that is, the main characteristic of the present invention is utilizing a plurality of resistive negative feedback circuits, which are installed with corresponding switch devices and located in a plurality of paths the feedback signal passes in various gain modes, to respectively process the feedback signal in various gain modes in order to keep the input impedance of the amplifier substantially fixed in various gain modes.

Figure 6:
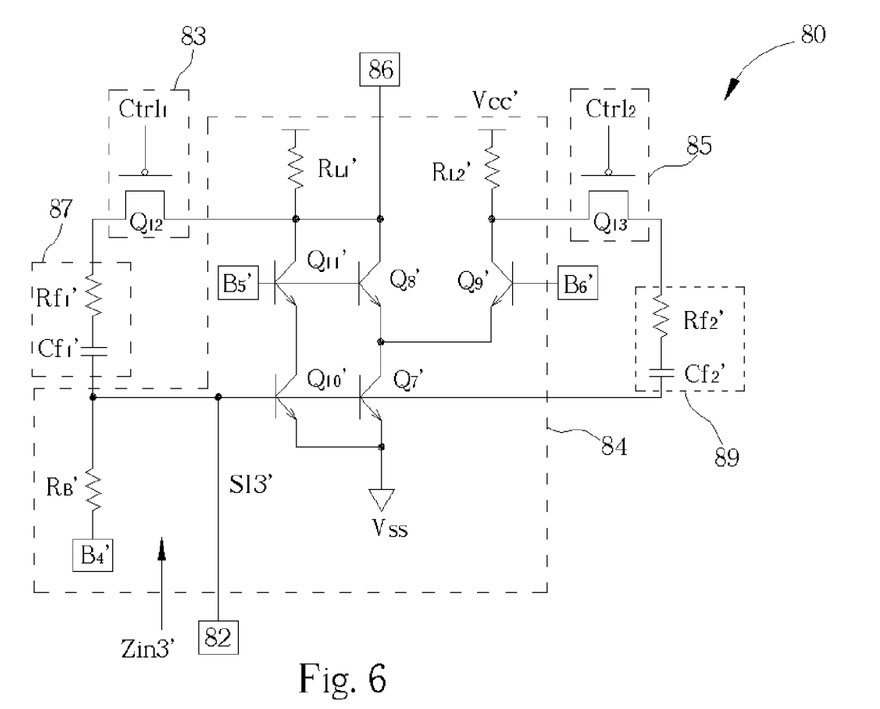
FIG. 6 is a schematic diagram of another embodiment showing an amplifier according to the present invention.
Figure 7:
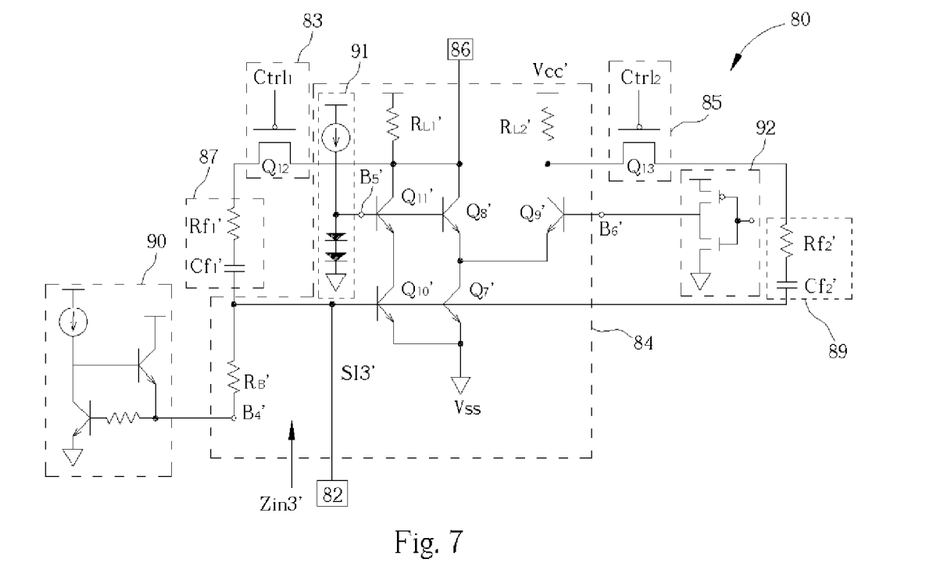
FIG. 7 is a schematic diagram of a detailed embodiment shown in FIG. 6.
Figure 8:
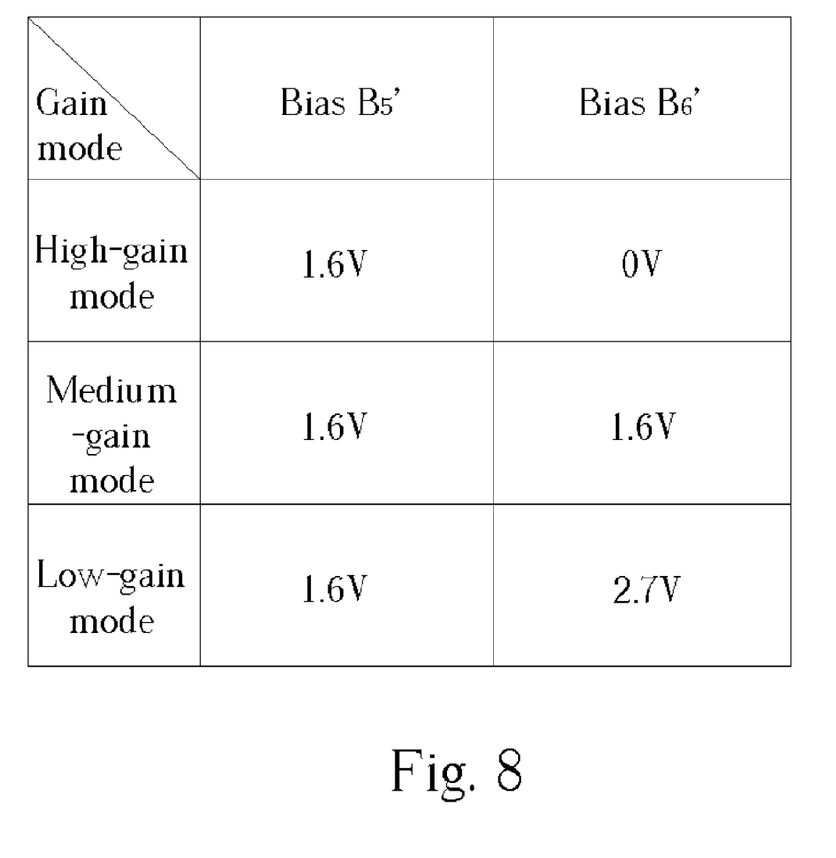
FIG. 8 is a list illustrating three biases shown in FIG. 7.
Figure 9:
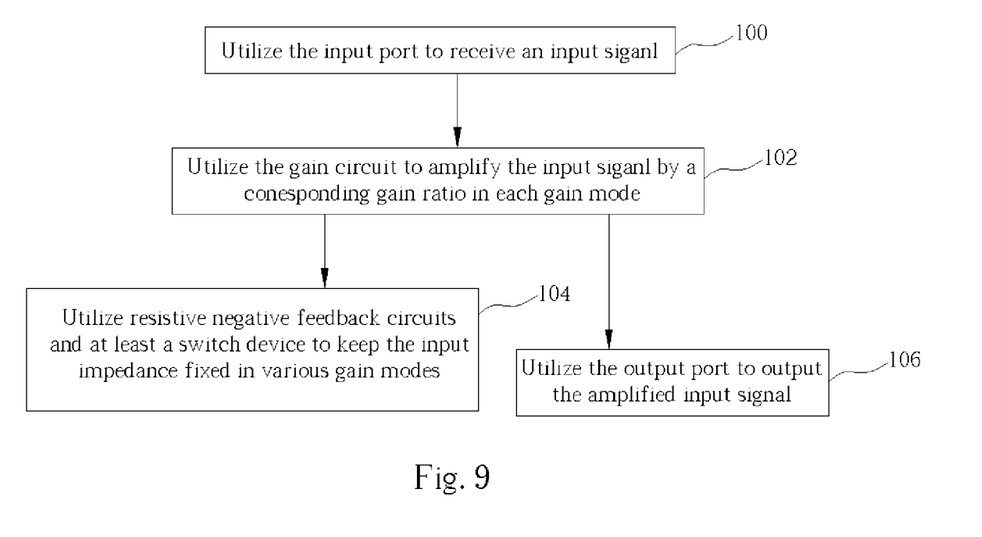
FIG. 9 is a flow chart showing a method embodiment according to the present invention.

Please notice that the above-mentioned embodiments of amplifiers shown in FIG. 5 to FIG. 7 are mainly applied in the receiver of a wireless communications system to be a low-noise amplifier. In summary, the method of the present invention for keeping the input impedance of the amplifier substantially fixed in a plurality of gain modes can refer to FIG. 9, which is a flow chart showing a method embodiment according to the present invention. The amplifier includes an input port, a gain circuit, at least a switch device, a plurality of resistive negative feedback circuits, and an output port. The present invention includes following steps:

Step 100: utilize the input port to receive an input signal;

Step 102: utilize the gain circuit to amplify the input signal by a corresponding gain ratio in each gain mode;

Step 104: utilize the plurality of resistive negative feedback circuits and at least a switch device to keep the input impedance of the amplifier substantially fixed in various gain modes. In detail, operate at least a switch device to make the feedback signal feed back through at least a corresponding resistive negative feedback circuit to the input port in various gain modes, so that the input impedance of the amplifier remains substantially fixed in various gain modes;

Step 106: utilize the output port to output the input signal amplified by the gain circuit.

Figure 10:
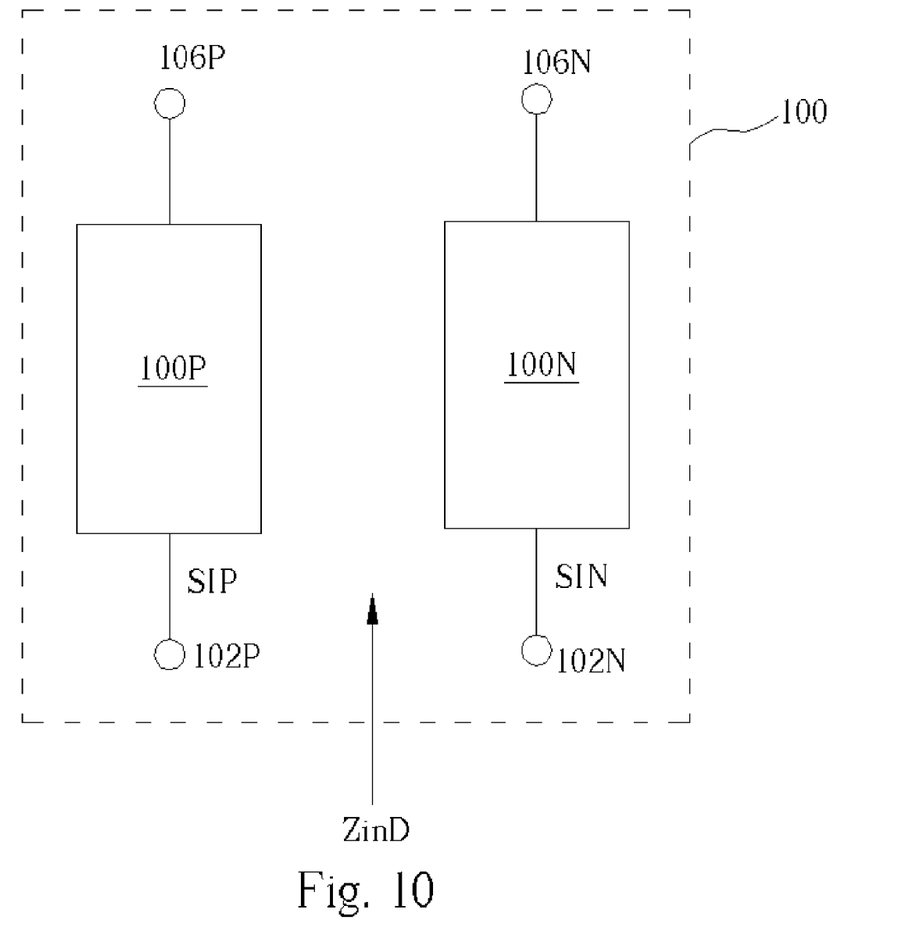
FIG. 10 is a functional block diagram of a differential amplifier according to the present invention.
Figure 11:
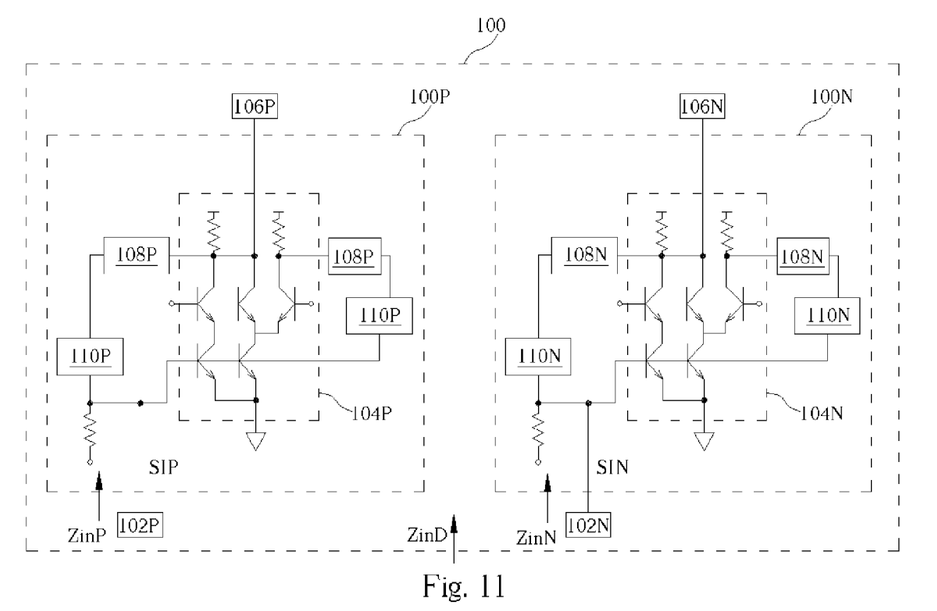
FIG. 11 is a schematic diagram of a detailed embodiment of the differential amplifier shown in FIG. 10.

Another main characteristic of the present invention is the characteristic of a differential amplifier. The differential amplifier of the present invention can be implemented by merging two amplifiers shown in FIG. 5 to FIG. 7, and wherein one of the two amplifiers is treated as a positive amplifier circuit while the other as a negative amplifier circuit. The output signal is a difference between the two output signals of the two amplifiers. Please refer to FIG. 10, which is a functional block diagram of a differential amplifier 100 according to the present invention. The differential amplifier 100 includes a positive input port 102P, a negative input port 102N, a positive amplifier circuit 100P, a negative amplifier circuit 100N, a positive output port 106P, and a negative output port 106N. The differential amplifier 100 further includes an input impedance ZinD. The positive input port 102P is used to receive a positive input signal SIP, and the negative input port 102N is used to receive a negative input signal SIN. The positive amplifier circuit 100P is electrically connected to the positive input port 102P, and the negative amplifier circuit 100N is electrically connected to the negative input port 102N. In addition, the positive output port 106P is electrically connected to the positive amplifier circuit 100P in order to output the positive input signal SIP processed by the positive amplifier circuit 100P; the negative output port 106N is electrically connected to the negative amplifier circuit 100N in order to output the negative input signal SIN processed by the negative amplifier circuit 100N. Actually, the positive input port 102P, the positive amplifier circuit loop, and the positive output port 106P can be combined to be regarded as a disclosed low-noise amplifier (shown in FIG. 5 to FIG. 7) according to the present invention. Similarly, the negative input port 102N, the negative amplifier circuit 100N, and the negative output port 106N can also be combined to be regarded as an (low-noise) amplifier. Please refer to FIG. 11, which is a schematic diagram of a detailed embodiment of the differential amplifier 100 shown in FIG. 10, and the embodiment shown in FIG. 11 is implemented by merging the two amplifiers 80 shown in FIG. 6. The differential performance of the differential amplifier depends on the accuracy of the phase difference between the positive input signal and the negative input signal. When the phase difference is not accurate, a common mode signal will emerge to affect the differential performance. As shown in FIG. 11, the positive amplifier circuit 100P includes a positive gain circuit 104P, a plurality of (two) positive resistive negative feedback circuits 110P, and a plurality of (two) positive switch devices 108P. The positive gain circuit 104P is used to amplify the positive input signal SIP by a corresponding gain ratio for in each gain mode, and the plurality of positive resistive negative feedback circuits 110P and the positive switch devices 108P can be used to keep the input impedance ZinP of the positive amplifier circuit 100P substantially fixed in various gain modes. The negative amplifier circuit 100N operates the same as the positive amplifier circuit 100P does.

According to the preceding paragraph, the positive amplifier circuit 100P and the negative amplifier circuit 100N have substantially fixed input impedances in various gain modes. Therefore, we can implement the positive amplifier circuit 100P and the negative amplifier circuit 100N with two identical amplifiers so that the input impedance of the positive amplifier circuit 100P is equal to that of the negative amplifier circuit 100N in various gain modes (ZinP=ZinN). Due to that the input impedance ZinD of the differential amplifier 100 is a mathematical combination of the input impedance ZinP and the input impedance ZinN, the input impedance ZinD of the differential amplifier 100 can remain substantially fixed in various gain modes. That is, if each amplifier contained in the differential amplifier 100 has the substantially fixed input impedance, the input impedance ZinD of the differential amplifier 100 will remain substantially fixed. In addition, since the differential amplifier 100 operates in the differential mode, the differential amplifier 100 has more advantages than do general single-ended amplifiers, such as the embodiments shown in FIG. 5 to FIG. 7. With the characteristics of the differential mode, the differential amplifier 100 can get rid of being interfered and generating interference, generating less $2^{nd}$ order interception point (IP2) in the front-end of the receiver with less DC offset. In addition, the frequency response of the differential amplifier 100 is wider than that of general single-ended amplifiers. Being a low-noise differential amplifier, the differential amplifier of the present invention can be applied to a wireless communications system.

According to the present invention, an amplifier with substantially fixed input impedance is disclosed. In the amplifier, a plurality of resistive negative feedback circuits are respectively installed in a plurality of corresponding paths through which a feedback signal will pass in various gain modes. In each gain mode, at least a corresponding resistive negative feedback circuit will be used to process the corresponding feedback signal, so that the input impedance of the amplifier can remain substantially fixed in various gain modes. Therefore, the distortion of a filtering response caused by impedance mismatch can be avoided. In addition, a differential amplifier with substantially fixed input impedance is also disclosed to meet various requirements in communications systems.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An amplifier with substantially fixed input impedance when operating in a plurality of gain modes, the amplifier comprising:
   an input port for receiving an input signal;
   a gain circuit for amplifying the input signal by corresponding gain ratios in various gain modes;
   a plurality of resistive negative feedback circuits selectively connected to the input port and the gain circuit for keeping the input impedance of the amplifier substantially fixed in the various gain modes, each of the various gain modes having at least one corresponding resistive negative feedback circuit that is connected only in the corresponding mode; and
   an output port for outputting the input signal amplified by the gain circuit.

2. The amplifier of claim 1 wherein in each of the various gain modes, a feedback signal is fed back to the input port via at least a resistive negative feedback circuit corresponding to a current gain mode so as to keep the input impedance of the amplifier substantially fixed in the various gain modes.

3. The amplifier of claim 2 further comprising a plurality of switch devices respectively electrically connected in series with the plurality of resistive negative feedback circuits for controlling whether a respective feedback signal is fed back to the input port via each of the plurality of resistive negative feedback circuits according to a current gain mode.

4. The amplifier of claim 1 wherein the gain circuit comprises a plurality of bipolar junction transistors or a plurality of MOS transistors.

5. The amplifier of claim 1 wherein the plurality of resistive negative feedback circuits are respectively a resistor being electrically connected in series with a capacitor.

6. The amplifier of claim 1 being a low-noise amplifier.

7. The amplifier of claim 6 being applied to a receiver of a wireless communication system.

8. A method used in an amplifier for keeping the input impedance of the amplifier substantially fixed in a plurality of gain modes, the method comprising:
   providing a gain circuit for amplifying an input signal by corresponding gain ratios according to the gain modes;
   providing at least one resistive negative feedback circuit for each of the various gain modes, each resistive negative feedback circuit being selectively connected to the gain circuit and the input signal;
   utilizing the gain circuit to switch the amplifier among the various gain modes that is connected only in the corresponding mode; and
   utilizing the plurality of resistive negative feedback circuits to keep the input impedance of the amplifier substantially fixed in various gain modes.

9. The method of claim 8 wherein the amplifier further comprises an input port and an output port, the method further comprising:
   utilizing the input port to receive the input signal;
   in each of the various gain modes, making a feedback signal be fed back to the input port via at least a resistive negative feedback circuit corresponding to a current gain mode so that the input impedance of the amplifier remains substantially fixed in the various gain modes, wherein the feedback signal is related to the input signal; and
   utilizing the output port to output the input signal amplified by the gain circuit.

10. The method of claim 9 wherein the amplifier further comprises a switch device electrically connected in series with a predetermined resistive negative feedback circuit, the method further comprising:
   turning on or turning off the switch device according to the various gain modes to control whether the feedback signal passes through the predetermined resistive negative feedback circuit to the input port.

11. The method of claim 9 wherein the amplifier further comprises a plurality of switch devices; each switch device being respectively electrically connected in series with the plurality of resistive negative feedback circuits, the method further comprising:

turning on at least a switch device in each gain mode so that the feedback signal is fed back to the input port via a resistive negative feedback circuit corresponding to a current gain mode.

12. The method of claim 8 wherein the plurality of resistive negative feedback circuits are respectively a resistor being electrically connected in series with a capacitor.

13. The method of claim 8 wherein the amplifier is a low-noise amplifier.

14. The amplifier of claim 3, wherein when the gain circuit is operating in a predetermined gain mode corresponding to a predetermined resistive negative feedback circuit having a switch, the switch is turned on to allow the feedback signal to feed back to the input port via the predetermined resistive negative feedback circuit; and when the gain circuit is operating in a gain mode other than the predetermined gain mode, the switch is turned off to prevent the feedback signal from passing through the predetermined resistive negative feedback circuit.

15. The amplifier of claim 1 being a differential amplifier with substantially fixed input impedance when operating in the plurality of gain modes, the amplifier further comprising:

a negative side input port for receiving a negative side of the input signal;

a plurality of negative side resistive negative feedback circuits electrically connected to the negative side input port and the gain circuit for keeping the input impedance of the amplifier substantially fixed in the various gain modes, each of the various gain modes having at least one corresponding negative side resistive negative feedback circuit; and a negative side output port for outputting the negative side of the input signal amplified by the gain circuit.

16. The method of claim 10, further comprising:

when the gain circuit is operating in a predetermined gain mode corresponding to the predetermined resistive negative feedback circuit having the switch, controlling the switch to turn on to allow the feedback signal to feed back to the input port via the predetermined resistive negative feedback circuit; and when the gain circuit is operating in a gain mode other than the predetermined gain mode, controlling the switch to turn off to prevent the feedback signal from passing through the predetermined resistive negative feedback circuit.

17. The method of claim 8 being utilized in a differential amplifier for keeping the input impedance of the differential amplifier substantially fixed in each of the plurality of gain modes, the method further comprising:

providing at least one negative side resistive negative feedback circuit for each of the various gain modes, each negative side resistive negative feedback circuit being electrically connected between a negative side of the input signal and the gain circuit.

* * * * *